United States Patent [19]

Ohashi

[11] Patent Number: 4,533,972
[45] Date of Patent: Aug. 6, 1985

[54] ELECTRONIC SWITCHING DEVICE HAVING REDUCED POWER CONSUMPTION

[75] Inventor: Takeo Ohashi, Suita, Japan

[73] Assignee: Omron Tateisi Electronics Co., Kyoto, Japan

[21] Appl. No.: 457,188

[22] Filed: Jan. 11, 1983

[30] Foreign Application Priority Data

Jan. 13, 1982 [JP] Japan .................... 57-4172

[51] Int. Cl.³ ............................. H01H 47/32
[52] U.S. Cl. ...................... 361/156; 361/208
[58] Field of Search ............. 361/156, 155, 208

[56] References Cited

U.S. PATENT DOCUMENTS 3,702,425 11/1972 Hoffmann et al. .............. 361/155
4,257,081 3/1981 Sauer et al. ................. 361/208 X
4,399,482 8/1983 Inoue ......................... 361/156 X

FOREIGN PATENT DOCUMENTS 22574 7/1980 Japan.

Primary Examiner—Reinhard J. Eisenzopf
Attorney, Agent, or Firm—Stevens, Davis, Miller & Mosher

[57] ABSTRACT

An electronic switching device employing a self-keeping type relay having an exciting coil (41), which comprises a signal generator (1), a first switching transistor (5) connected through a diode (43) to the coil, a second capacitor (42) connected in series with the coil, a second switching transistor (44) connected across the coil and the second capacitor, a first capacitor connected across the second capacitor, the coil, the diode and the first switching transistor, a high resistance circuit (3) interposed between a power source (E) and the first capacitor, whereby the exciting coil is supplied with a positive momentary discharging current from the first capacitor through the first switching transistor so as to set the relay and the second capacitor and is supplied with a negative momentary discharging current from the second capacitor through the second switching transistor so as to reset the relay.

9 Claims, 5 Drawing Figures

ELECTRONIC SWITCHING DEVICE HAVING REDUCED POWER CONSUMPTION

BRIEF SUMMARY OF THE INVENTION

This invention relates to an electronic switching device, and more particularly to an improved electronic switching device employing an electromagnetic switch for switching a load connected thereto.

There is well known in a conventional control system field an electronic switching device which includes an electromagnetic switch and an electronic circuit driving the electromagnetic switch, such as an electronic timer, an electronic counter, a photoelectric switch, a logic relay and so on. Such a conventional electronic switching device is designed such that the electronic circuit, in response to an external input signal applied thereto or an internally developed signal, energizes the electromagnetic switch so as to close or open its normally-opened or -closed contacts which are connected to a load to be switched. In order to keep the electromagnetic switch, e.g. an electromagnetic relay, in such a closed or opened position, the electronic circuit must continue to energize an exciting coil of the electromagnetic switch so as to close or open the contacts, so that the energizing coil consumes a relatively large amount of electric power. Thus, the conventional electronic switching device consumes a relatively large amount of electric power and must be provided with a large electric power source, which wastes energy.

It is, therefore, a primary object of this invention to provide an electronic switching device which includes a self-latching type electromagnetic switch adapted to keep its position after the deenergization of an exciting coil thereof and an electronic circuit designed to drive the electromagnetic switch with a reduced electric power consumption.

It is a further object of this invention to provide an electronic switching device further including a self-latching type electromagnetic switch, a charging-and-discharging capacitor, and a current regulator or a resistance circuit interposed between a power source and the capacitor so that the electromagnetic switch is energized by a momentary electric power discharged from the capacitor.

According to one aspect of this invention, there is provided an electronic switching device including a self-latching type electromagnetic switch, such as a polarized electromagnet relay employing a permanent magnet, a stepping relay and so forth, a charging-and-discharging capacitor, a current regulating means or a resistance circuit interposed between a power source and the capacitor, and a switching means associated with the capacitor, all arranged so that the electromagnetic switch is actuated to a set or a reset position by a momentary power which is discharged from the capacitor and controlled by the switching circuit, whereby the power source for the electronic switching device can be reduced to such a small power capacity that it provides the capacitor with a minor current for a predetermined charging time duration, and power consumption by the electronic switching device is reduced.

Other objects, features and advantages of this invention will be apparent upon reference to the following description in conjunction with accompanying drawings, in which:

DETAILED DESCRIPTION

Figure 1:
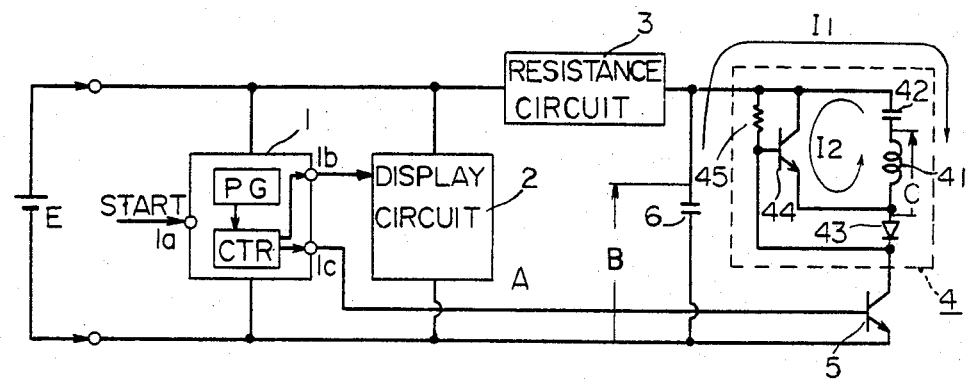
FIG. 1 is a schematic circuit block diagram showing an electronic switching device which is employed as an electronic timer as a preferred embodiment of this invention.

Referring, now, to FIG. 1, there is shown an electronic switching device as a preferred embodiment of this invention. The electronic switching device in this embodiment is employed as an electronic timer including a timer circuit 1 as a signal generating means and a display circuit 2 which are connected in parallel with a d.c. power source E. The d.c. power source E is further connected with a resistance circuit or a resistance 3 having a relatively high impedance acting as a current regulating means, a self-latching type relay circuit 4, a switching transistor 5 acting as a first switching means, and a first charging-and-discharging capacitor 6.

The timer circuit 1 has a conventional circuit construction including a clock pulse generator PG and a pulse counter CTR. When the counter CTR counts up to a predetermined number of clock pulses generated from the clock pulse generator PG in accordance with a desired time duration preset in the timer circuit, it provides a base of the transistor 5 with an output signal, e.g., a high level output signal. The timer circuit 1 is constructed as an integrated C-MOS circuit whose power consumption is extremely reduced. The display circuit 2 is supplied with a time signal developed from the counter CTR in the timer circuit 1 so as to display a time elapsing in the circuit 1. In order to reduce a power consumption in this electronic switching device, the display circuit 2 employs a liquid crystal display or the like.

The capacitor 6 is charged through the resistance 3 during the time when the timer circuit 1 counts a predetermined preset time, while when the predetermined preset time has been counted up, the capacitor 6 provides the circuit 4 with a discharged power therefrom.

The self-latching type relay circuit 4 includes an exciting coil 41. The coil 41 is employed in a self-latching type electromagnetic relay which is set by a positive current applied to the coil 41 and reset by a negative current applied thereto, such as a polarized relay employing a permanent magnet. The circuit 4 further includes a second charging-and-discharging capacitor 42, a diode 43, a switching transistor 44 acting as a second switching means and a resistance 45, which are designed with the transistor 5 so as to set or reset the relay having the coil 41 on the basis of a momentary power discharged from the capacitor 6. The capacitor 42 is adapted to be charged by the discharged power from the capacitor 6 so that when the transistor 5 is turned off, it provides the coil 41 with a reversal current or a negative discharging current to reset the relay.

Figure 2:
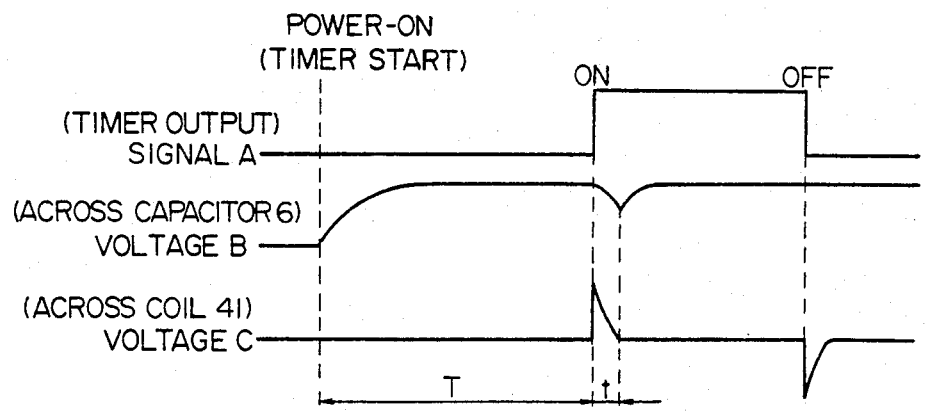
FIG. 2 shows graphical representations of the voltage wave forms in the device of FIG. 1.

FIG. 2 shows the respective representations of the voltage wave forms in the device of FIG. 1. When the d.c. power source E is applied to the device of FIG. 1, the timer circuit 1 is initiated to count a predetermined preset time while its output signal A at its output terminal 1c is a low level as illustrated in FIG. 2. Then, the transistor 5 is switched off or turned off, viz. rendered nonconductive, so that no energy is applied to the coil 41, while the capacitor 6 is charged by the power source E through the resistance 3. When the counter circuit 1 counts up a first predetermined preset time, its output signal A becomes a high level, so that the transistor 5 is switched or turned on, viz. rendered conductive, and a momentary power discharged from the capacitor 6 is applied to the coil 41 through the capacitor 42 while the transistor 44 is turned off. Then, the relay having the energized coil 41 is set so as to close its normally opened contacts (not shown in drawings). That is, when the output signal A from the timer circuit 1 becomes high, a positive discharging or energizing current flows through the coil 41 during a time period t shown in FIG. 2, viz. until the charge in the capacitor 42 is saturated. Such a momentary energizing current sets the relay of the coil 41, so that the relay keeps a set position wherein the normally opened contacts remain closed without any energy to the coil 41.

When the timer circuit 1 counts up a second predetermined preset time, the output signal A returns to the low level, so that the transistor 5 is turned off, and the transistor 44 is turned on by bleeder resistances composed of the resistance 45 and the reversly-biased high resistance diode 43. Then, a power charged in the capacitor 42 is discharged through the transistor 44, from a collector to an emitter thereof, so as to provide the coil 41 with a momentary reversal current or a negative discharging current. Such a momentary reveral current flows through the coil 41 until the capacitor 42 is completely discharged by the coil 41, whereby the relay of the coil 41 is reset so as to open the normally-opened contacts.

Thus, according to this embodiment, the self-latching type relay employing the exciting coil 41 is set by a momentary power discharged from the capacitor 6 and is reset by a momentary power discharged from the capacitor 42 charged by the capacitor 6. Since all of the energy required to set and reset the relay is supplied from the capacitor 6 which is fully charged with a minor current through the resistance 3 from the power source E and consumed on the setting or resetting of the relay, a reduced power source may be employed as the source E and additional energy is not needed to keep the relay in a set or reset position. Moreover, since the timer circuit 1 employs a C-MOS integrated circuit and the display circuit 2 employs a liquid crystal display, the electronic timer of FIG. 1 very advantageously saves energy. Particularly, the device of FIG. 1 is advantageous when the power source E is designed for a multirange power source capable of converting an external power source ranging, e.g. from 12 V to 240 V d.c./a.c., to a predetermined voltage applicable to the device.

For example, the device of FIG. 1 may be designed such that the resistance 3 is 1,000 ohms, the capacitor 6 is 500 microfarads, the capacitor 42 is 10 microfarads, and a minimum current for exciting the coil 41 is 100 milliamperes. When a 10 milliampere maximum, 12 volt d.c. power source is employed as the source E, the capacitor 6 is fully charged in 0.5 second from the timer start time point and the coil 41 can be perfectly excited in either current directions. Thus, the power source E is reduced from 100 mA $\times$ 12 V power source to a 10 mA $\times$ 12 V power source.

Figure 3:
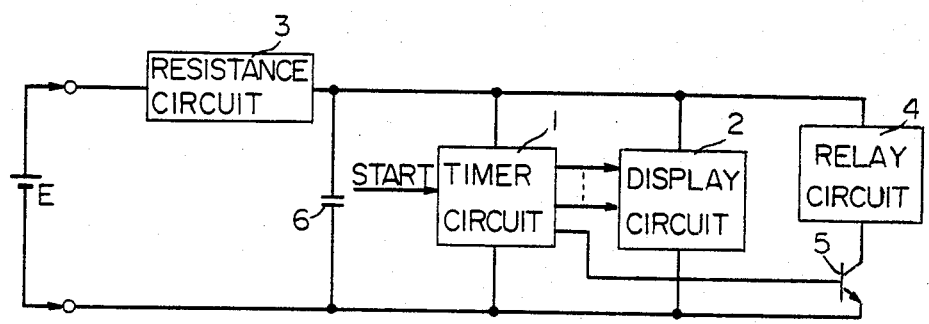
FIG. 3 is a schematic circuit block diagram showing an electronic switching device as another modification of the embodiment of FIG. 1.

In FIG. 3, there is shown a modified device of FIG. 1 wherein the resistance circuit 3 and the capacitor 6 are interposed between the power source E and the timer circuit 1. In this modified embodiment, there are provided the same operations and advantages as those in the device of FIG. 1. Though a power supplied to the timer circuit 1 is instantaneously dropped to a certain extent on turning on the transistor 5 so as to discharge the capacitor 6, the timer circuit 1 is constructed as a C-MOS integrated circuit which is usable with a power source varying within a relatively wide voltage range, so that such a power drop does not affect the operations in the circuit 1. Moreover, even if the power applied to the display circuit 2 instantaneously drops, the circuit 2 does not cause any visual problem.

Figure 4:
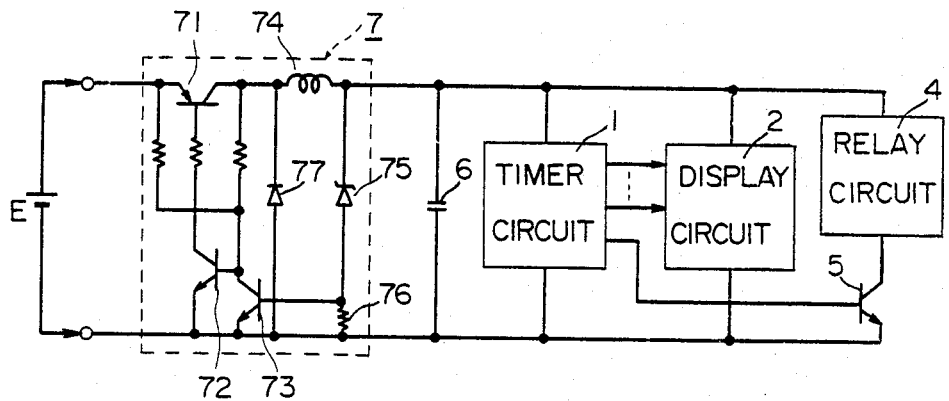
FIG. 4 is a schematic circuit block diagram showing an electronic switching device employing a switching regulator as another modification of the embodiment of FIG. 3.

In FIG. 4, there is shown a modified device of FIG. 3, wherein the resistance circuit 3 of FIG. 3 is replaced by a switching regulator 7 acting as a current regulating means. The regulator 7 is constructed by a conventional circuit which includes transistors 71, 72 and 73, a coil 74, a Zener diode 75, a resistance 76 and a diode 77. The transistors 71 through 73 constitute a self-driving type oscillating circuit. Upon supplying the circuit 7 with power, the transistor 71 is turned on so that an electric current flows through an emitter and a collector of the transistor 71 and the coil 74 to the timer circuit 1, the display circuit 2 and the capacitor 6. The capacitor 6 is charged up to a predetermined level, so that the diode 75 is turned on. Then, the transistor 73 is turned on and the transistors 72 and 71 are turned off, so that no electric current flows from the transistor 71 to the coil 74. But, an energy previously charged in the coil 74 is discharged through the diode 77 to the circuit 1 and other circuits. Upon the complete exhaustion of the energy charged in the coil 74, the power applied to the circuit 1 and other circuits drops so that the diode 75 is turned off. Then, the transistor 73 is turned off, and the transistors 72 and 71 are turned on, so that an electric current again flows through the transistor 71 to the circuit 1 and other circuits. By repeating the above-mentioned operations, the regulator 7 can provide the circuits 1 and 2 and the capacitor 6 with a regulated electric power. The switching regulator 7 in this embodiment is designed to have a low impedance, e.g. 20 ohms, receive an unstable external power source, e.g. varying between 12 V and 240 V and generate a predetermined regulated voltage, e.g. 5 V, based on the Zener diode 75. The regulator 7, however, may employ a relatively small capacity type regulator, e.g. capable of generating 10 milliampere output current in spite of a large current relay circuit 4 necessitating about a 100 milliampere exciting current because the circuits 1, 2, 4, 5 and 6 are designed to consume an extremely reduced amount of power. Instead of the switching regulator 7, a d.c./d.c. convertor may be employed.

Figure 5:
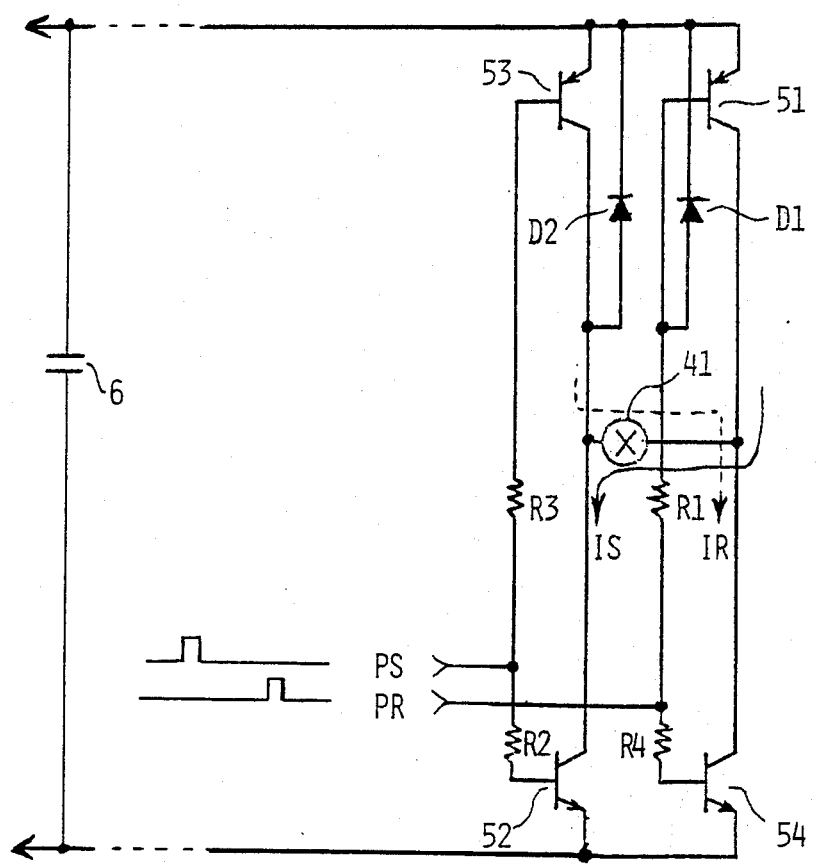
FIG. 5 shows a modified device of FIG. 4.

FIG. 5 partially shows a modified device of FIG. 4, wherein the relay circuit 4 is modified to include coil 41, the first regulating means is modified to include a pair of set switching transistors 51 and 52 and a pair of reset switching transistors 53 and 54, and the timer circuit 1 is modified to generate a set pulse PS and a reset pulse PR for application to the modified first switching means. As is apparent from the drawing, when the set pulse PS, e.g. 10 mS, is applied to the switching means, a set current IS flows through transistors 51 and 52, or when the reset pulse PR, e.g. 10 mS, is applied to the switching means, a reset current IR flows through transistors 53 and 54. Thus, positive and negative discharging currents IR and IS from the capacitor 6 are alternately applied to the coil 41 so as to set and reset the relay, respectively. This modified device, of course, can be applied to the above embodiments with a simple modification.

As another modification of the foregoing embodiments, the timer circuit 1 may be replaced by any equivalent logic circuit generating an output signal as illustrated in the wave form A of FIG. 2, such as a detecting circuit of a photoelectric switch, a proximity switch, an ultrasonic sensing switch or the like. If desired, the display circuit 2 may be omitted. Moreover, by omitting the circuits 1 and 2, the modified electronic switching device may be used as a logic circuit in which an external input signal is applied directly to the base of the transistor 5 or indirectly through an input circuit to the same so as to provide the transistor 5 with a signal similar to the wave form A. It should be understood, however, that in any of above-mentioned modifications, the transistor 5 should not be turned on or off within a predetermined time period. For example, the transistor 5 should not be turned off within the period t in FIG. 2; that is, while the capacitor 42 is being changed.

Though the self-latching type relay having the coil 41 in the foregoing embodiments is set or reset by a positive or a negative direction energizing or discharging current thereto, the electronic switching device in any of the foregoing embodiments may be further modified so as to employ the following self-latching type electromagnetic relays. As one of the relays, an electromagnetic relay including a setting coil and a resetting coil may be employed wherein the circuit 4 solely consists of the set and reset coils. First and second switching transistors are used as the first switching means (5) with their collectors being respectively connected to the set and reset coils, and their emitters being commonly connected to each other. The respective set and reset coils are energized by the first and second transistors which have applied thereto respective narrow width set and reset pulses. As another of the relays, a stepping-type electromagnetic relay, viz. a push-on-and-push-off type relay, may be so employed in another further modified electronic switching device wherein the circuit 4 solely consists of the exciting coil 41, and the switching transistor 5 is turned on by each narrow gate pulse applied to the base thereof.

Thus, according to this invention, there is provided an electronic switching device including a self-keeping type relay circuit (4), a resistance (3) interposed between a power source (E) and the relay circuit, and a charging-and-discharging capacitor (6) connected in series with the relay circuit through a switching component (5), wherein upon a gate signal applied to the switching component, the capacitor provides the relay circuit with a momentary power discharged therefrom so as to actuate a self-latching type electromagnetic relay associated with the relay circuit so that the power consumed by the switching device is reduced.

It should be understood that the above description is merely illustrative of this invention and that many changes and modifications may be made by those skilled in the art without departing from the scope of the appended claims.

What is claimed is:

1. An electronic switching device including a self-latching electromagnetic switch for switching a load connected to the switch, which comprises
    a self-latching relay circuit including an exciting coil,
    first switching means connected in series with said relay circuit for controlling an electric current applied to the same,
    current regulating means interposed between a power source and said relay circuit,
    a first capacitor connected across said relay circuit and said first switching means which are connected in series so as to be charged by said power source to a steady state value through said current regulating means within a predetermined time period,
    a signal generating means for generating an output signal which is applied to said first switching means as a controlling signal thereto, said controlling signal causing said first switching means to initiate a discharge of said first capacitor to produce a current in said exciting coil in a first direction, and,
    means for causing a discharge of current from said first capacitor to produce a current in said exciting coil in a second direction opposite to the first.

2. An electronic switching device according to claim 1, wherein said signal generating means is a timer circuit.

3. An electronic switching device according to claim 1, wherein said current regulating means is a resistance.

4. An electronic switching device according to claim 1, wherein said current regulating means is a switching regulator.

5. An electronic switching device according to claim 1, wherein said means for causing includes a second capacitor connected in series with said coil, and second switching means connected across said coil and second capacitor, whereby when said first switching means is turned on, a positive discharging current is applied to said coil from said first capacitor through said first switching means and said second capacitor, and when said first switching means is subsequently turned off, said second switching means is turned on and a negative discharging current is applied to said coil from said second capacitor through said second switching means.

6. The electronic switching device according to claim 1, further comprising a first pair of relay setting switching transistors acting as said first switching means and a second pair of relay resetting switching transistors acting as said means for causing.

7. An electronic switching device according to claim 6, wherein said signal generating means supplies first and second output signals for operating said first and second pairs of transistors.

8. An electronic switching device according to claim 1, wherein said signal generating means generates an output signal which has a duration greater than the period of discharge of said first capacitor.

9. An electronic switching device according to claim 8, wherein said signal generating means generates said output signal after said first capacitor charges to said steady state value.

* * * * *